United States Patent
Visokay et al.

(10) Patent No.: US 10,249,621 B2
(45) Date of Patent: Apr. 2, 2019

(54) DUMMY CONTACTS TO MITIGATE PLASMA CHARGING DAMAGE TO GATE DIELECTRICS

(71) Applicant: Texas Instruments Incorporated, Dallas, TX (US)

(72) Inventors: Mark Robert Visokay, Dallas, TX (US); Tae S. Kim, Dallas, TX (US); Mahalingam Nandakumar, Richardson, TX (US); Eric D. Rullan, Allen, TX (US); Gregory B. Shinn, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/380,546

(22) Filed: Dec. 15, 2016

(65) Prior Publication Data

US 2018/0175023 A1 Jun. 21, 2018

(51) Int. Cl.
*H01L 27/00* (2006.01)
*H01L 27/088* (2006.01)
(Continued)

(52) U.S. Cl.
CPC ...... *H01L 27/088* (2013.01); *H01L 21/31116* (2013.01); *H01L 21/31144* (2013.01); *H01L 21/76802* (2013.01); *H01L 21/76877* (2013.01); *H01L 21/823475* (2013.01); *H01L 21/823871* (2013.01); *H01L 23/522* (2013.01); *H01L 27/092* (2013.01); *H01L 29/42364* (2013.01);
(Continued)

(58) Field of Classification Search
CPC ......... H01L 21/31116; H01L 21/31144; H01L 21/76802; H01L 21/76877; H01L 21/823475; H01L 21/823871; H01L 27/092; H01L 29/42364; H01L 29/66545; H01L 23/528
See application file for complete search history.

(56) References Cited

U.S. PATENT DOCUMENTS 5,422,309 A * 6/1995 Zettler ............... H01L 21/31144
148/DIG. 50
5,756,395 A * 5/1998 Rostoker ............. H01L 23/5226
257/E23.145

(Continued)

*Primary Examiner* — Dale E Page
*Assistant Examiner* — Quovaunda V Jefferson
(74) *Attorney, Agent, or Firm* — Andrew R. Ralston; Charles A. Brill; Frank D. Cimino

(57) ABSTRACT

A method of limiting plasma charging damage on ICs. A die includes gate stacks on active areas defined by a field dielectric. A pre-metal dielectric (PMD) layer is over the gate electrode. A contact masking material pattern is defined on the PMD layer including first contact defining features for forming active contacts and second contact defining features for forming dummy contacts (DC's) including over active areas and gate electrodes. Contacts are etched through the PMD layer using the contact masking material pattern to form active contacts and DC's. A patterned metal 1 (M1) layer is formed including first M1 portions over the active contacts and dummy M1 portions over the DC's. Metallization processing follows including forming interconnects so that the active contacts are connected to MOS transistors on the IC, and the DC's are not electrically connected to the MOS transistors.

20 Claims, 4 Drawing Sheets

(51) Int. Cl.
*H01L 21/311* (2006.01)
*H01L 21/768* (2006.01)
*H01L 21/8234* (2006.01)
*H01L 29/423* (2006.01)
*H01L 27/092* (2006.01)
*H01L 21/8238* (2006.01)
*H01L 29/66* (2006.01)
*H01L 23/522* (2006.01)
*H01L 29/49* (2006.01)

(52) U.S. Cl.
CPC ...... *H01L 29/66545* (2013.01); *H01L 29/495* (2013.01); *H01L 29/4916* (2013.01); *H01L 29/4966* (2013.01)

(56) References Cited

U.S. PATENT DOCUMENTS

| | | | | |
|---|---|---|---|---|
| 6,306,755 | B1* | 10/2001 | Zheng | H01L 21/76802 |
| | | | | 257/E21.577 |
| 6,455,894 | B1* | 9/2002 | Matsumoto | H01L 21/84 |
| | | | | 257/347 |
| 2004/0026762 | A1* | 2/2004 | Hirano | H01L 27/0629 |
| | | | | 257/536 |
| 2009/0127634 | A1* | 5/2009 | Tsuno | H01L 27/0207 |
| | | | | 257/390 |
| 2010/0052065 | A1* | 3/2010 | Diaz | H01L 21/823807 |
| | | | | 257/369 |
| 2015/0171008 | A1 | 6/2015 | Luo et al. | |

* cited by examiner

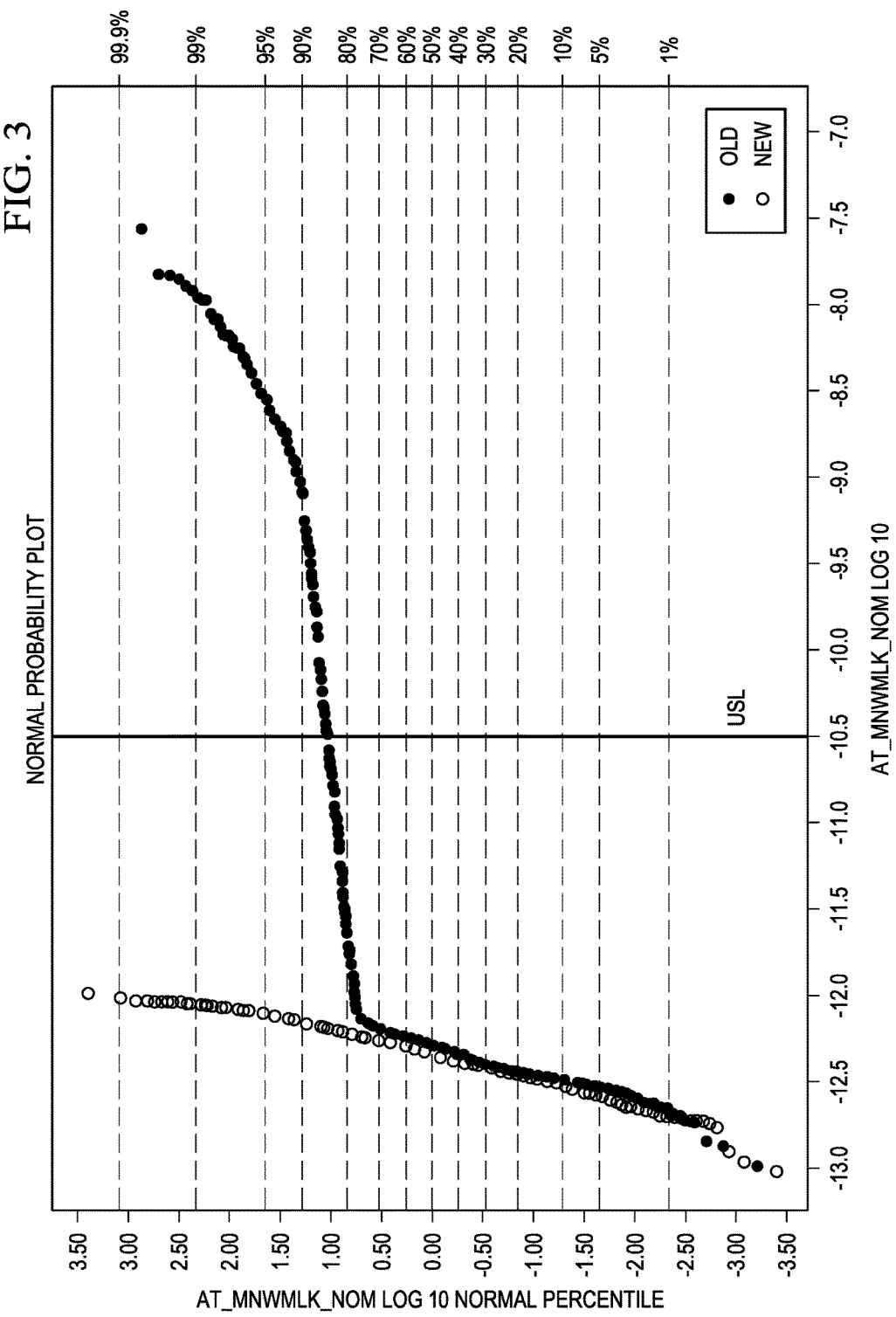

DUMMY CONTACTS TO MITIGATE PLASMA CHARGING DAMAGE TO GATE DIELECTRICS

FIELD

Disclosed embodiments relate to mitigating plasma charging damage to the gate dielectric for metal-oxide-semiconductor (MOS) devices.

BACKGROUND

The antenna effect is a form of plasma-induced gate dielectric (e.g., silicon oxide) damage that can cause yield and reliability problems during the manufacturing of MOS integrated circuits (ICs). Semiconductor fabs generally have a set of antenna rules for avoiding this problem.

An antenna violation is caused by the accumulation of excess electrical charge. A typical completed integrated circuit (IC) has "nets" including at least one driver which includes a source diffusion or drain diffusion, and at least one receiver including a gate electrode (e.g., doped polysilicon) over a thin gate dielectric that is over the substrate. Since the gate dielectric may be quite thin, such as only being a few molecules thick, a concern is the dielectric breakdown of this dielectric layer. Dielectric breakdown can happen due to the resulting electric field across the dielectric if the net acquires a voltage higher than the normal operating voltage of the IC.

Once the chip has completed fabrication, the antenna effect generally cannot happen, since every net has at least a source and a drain connected to it which protects it. The source and drain form a diode, which conducts in the forward direction or breaks down at a lower voltage than that of the gate dielectric oxide (either forward diode conduction, or reverse breakdown), and either conducts or breaks down non-destructively. This action protects the gate dielectric from dielectric breakdown.

However, during fabrication of the IC, the gate dielectric may not be protected by any diode, such as while metal 1 is being etched. Since metal 2 is not formed yet, there is no diode connected to the gate dielectric. Accordingly, if electrical charge is added in any way (such as by plasma etching) to an isolated piece of metal 1 it can rise to reach a voltage level capable of breaking down the gate dielectric. In particular, plasma etching or reactive-ion etching (RIE) of the first metal layer can result in this situation, where the net is disconnected from the initial global (blanket) metal layer, and this etching adds charges to each isolated piece of metal 1.

Leaky gate dielectrics, although a problem for power dissipation, help avoid dielectric damage from the antenna effect. A leaky gate dielectric can prevent a charge from building up to the point of causing gate dielectric breakdown. This leads to the result where a very thin gate dielectric may be less likely to be damaged than a thicker gate dielectric because as the gate dielectric grows thinner, the leakage goes up generally exponentially, but the breakdown voltage shrinks only basically linearly.

SUMMARY

This Summary is provided to introduce a brief selection of disclosed concepts in a simplified form that are further described below in the Detailed Description including the drawings provided. This Summary is not intended to limit the claimed subject matter's scope.

Disclosed embodiments recognize known solutions to the antenna effect involve changing process conditions to mitigate plasma charging damage to gate dielectrics. For example, the plasma etch radio frequency (RF) power may be lowered to mitigate the antenna effect. However, lower RF power for plasma etching may lead to a reduced etch rate and reduced etch tool throughput or utilization, or plasma instability problems if the RF power is too low. In contrast, disclosed solutions change the contacts on the IC to add dummy contacts (DC's) including in the active area, which results in the plasma charging damage to gate dielectric problem to be essentially eliminated without needing any fab process change(s).

Disclosed solutions add DC's to the metal 1 (M1) contact reticle (or mask) design to increase the number of contacts and thus the contact density including in the active area. The DC's are added using an algorithm to locate DC's in places where dummy M1 would overlap dummy active area and/or dummy polysilicon (or other gate electrode material). DC's can be placed in the reticle (or mask) to connect dummy M1 with a) dummy polysilicon on field oxide, b) dummy polysilicon on dummy active area, and/or c) dummy active area between dummy polysilicon features. DC's that would be spaced too closely to other contacts in violation of applicable IC design rules can be removed so they are not included in the contact reticle or mask.

Disclosed embodiments include a method of limiting plasma charging damage on ICs, and ICs having disclosed DC's. A die includes gate stacks on active areas defined by a field dielectric. A pre-metal dielectric (PMD) layer is over the gate electrode. A contact masking material pattern is defined on the PMD layer including first contact defining features for forming active contacts and second contact defining features for forming DC's including over active and gate electrode areas. Contacts are etched through the PMD using the contact masking material pattern to form active contacts and DC's. A patterned M1 layer is formed including first M1 portions over the active contacts and dummy M1 portions over the DC's. Metallization processing follows including forming interconnects so that the active contacts are connected to MOS transistors on the IC, and the DC's are not electrically connected to the MOS transistors.

BRIEF DESCRIPTION OF THE DRAWINGS

Reference will now be made to the accompanying drawings, which are not necessarily drawn to scale, wherein:

FIG. 3 shows measured data representing normal distribution plots of leakage current for an about 3 nm thick gate oxide indicative of plasma charging damage measured after the completion of wafer processing obtained from lots using a new contact reticle including DCs and using a contact reticle without disclosed DC's as a control.

DETAILED DESCRIPTION

Figure 1:
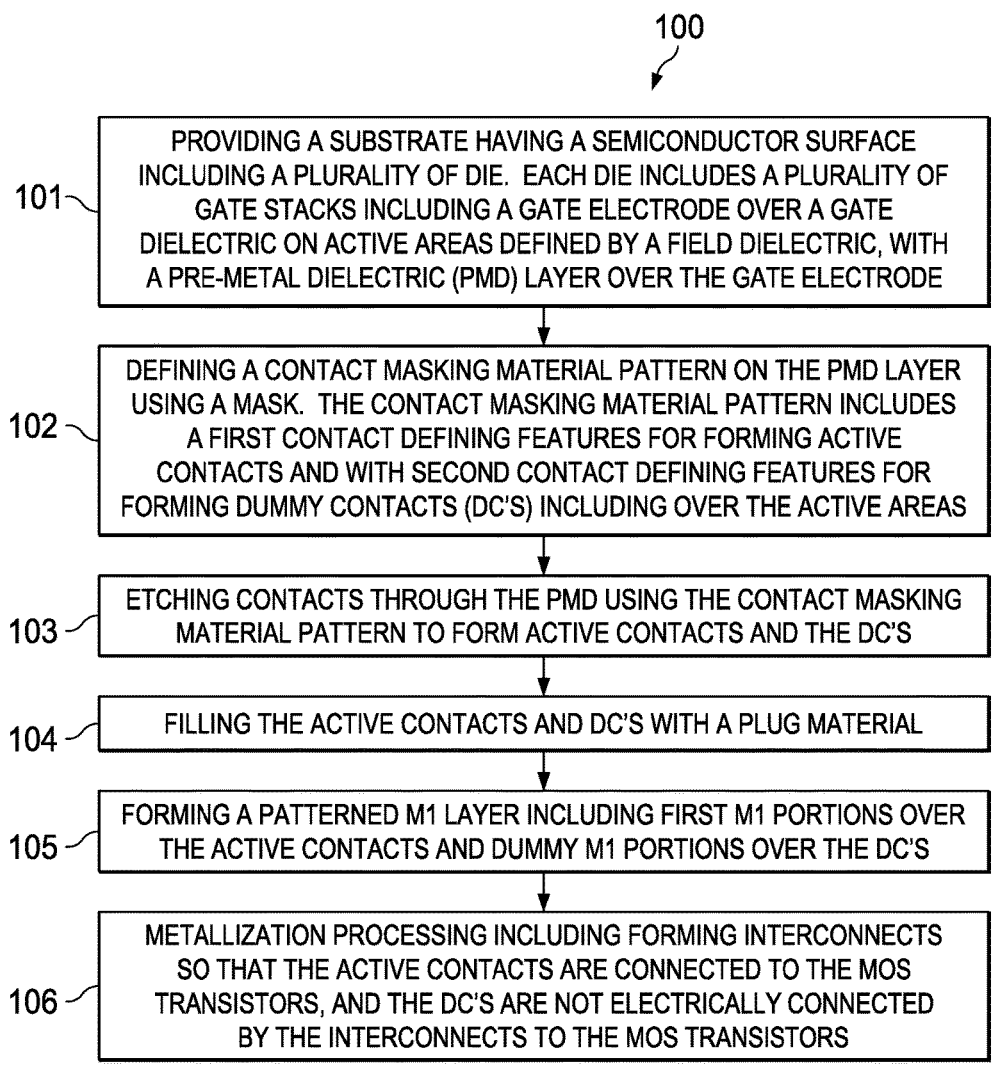
FIG. 1 is a flow chart that shows steps in an example method for forming contacts for an IC including DC's for mitigating plasma charging damage to the gate dielectric for MOS devices on the IC, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

FIG. 1 is a flow chart that shows steps in an example method 100 for forming contacts for an IC including DC's for mitigating plasma charging damage to the gate dielectric for MOS devices on the IC, according to an example embodiment. Step 101 comprises providing a substrate (e.g., a wafer) having a semiconductor surface including a plurality of die. Each die includes a plurality of gate stacks including a gate electrode over a gate dielectric on active areas defined by a field dielectric on a substrate, with a PMD layer that may also be termed an interlayer dielectric layer over the gate electrode.

The gate dielectric layer can comprise silicon oxide, nitrided silicon oxide, or a high-k dielectric material. The thickness of the gate dielectric layer is generally at least ($\geq$) 1.5 nm, such as 1.5 nm to 12 nm in the case of silicon oxide or an equivalent oxide thickness (EOT) of 1 nm to 12 nm for non-silicon oxide materials. The PMD can be silicon oxide, which in one embodiment can be deposited by chemical vapor deposition (CVD) using tetraethylorthosilicate (TEOS) as a precursor. The gate electrode can extend over the field dielectric so that the gate electrode is not confined to only active regions. If the gate electrode is over the field dielectric it is not electrically active in those regions in terms of controlling transistors, but the gate electrode can still serve as a connection between transistors.

The gate electrode comprises polysilicon in one specific embodiment. An optional etch stop layer, such as comprising silicon nitride (SiN or $Si_3N_4$) may be between the gate electrode and the PMD. Memory flows, such as dynamic random access memory (DRAM) flows, generally do not utilize a contact etch stop layer, as they instead use a self-aligned contact etch removing the need for an etch stop layer.

Step 102 comprises defining a contact masking material pattern (e.g., photoresist) on the PMD layer using a mask (e.g., reticle). The contact masking material pattern includes first contact defining features for forming active contacts, and second contact defining features for forming DC's. As in standard photolithography, a photoresist layer may be formed over the PMD, and the photoresist layer patterned and developed to expose selected locations. The photoresist layer is generally deposited by spin coating, and patterned by exposure to light or other electromagnetic radiation through a mask with transparent sections and opaque sections.

As used herein a "contact" refers to a connection between M1 and the active substrate, or M1 and polysilicon (dummy or not dummy on either active area or on a field oxide). "Dummy contacts" as used herein refers to contacts are not electrically connected to any electrical components (e.g., transistors, diodes) and thereby do not affect the operation of the IC. The M1 feature over DC's may or may not be coupled to any higher metal levels, such as metal 2 (M2). Dummy M1 can be connected to dummy M2 by a dummy via if the two dummy metal layers (M1, M2) are placed such that they overlap (see this feature in FIG. 2B described below). It is however not required that dummy M1 be connected to dummy M2. Step 103 comprises etching contacts through the PMD using the contact masking material pattern as an etch mask to form active contacts and DC's. The contact etching generally comprises plasma etching.

Step 104 comprises filling the active contacts and the DC's with an electrically conductive plug material. The plug material is conventionally tungsten (W), but there may also be barrier/liner material(s) deposited before the plug material fill into the contact openings, typically Ti and TiN. There can also be other contact materials such as copper. There is generally a step following the filling which comprises removing the contact fill material from everywhere but the contacts themselves. This is typically performed using a Chemical Mechanical Polishing (CMP) process, but other methods are also possible including a blanket etchback.

Step 105 comprises a patterned M1 layer including first M1 portions over the active contacts and dummy M1 portions over the DC's. Step 105 can comprise a damascene process or a subtractive etch process. Step 106 comprises metallization processing including forming interconnects so that the active contacts are connected to the MOS transistors, and the DC's are not electrically connected by interconnects to the MOS transistors. As noted above, dummy M1 can optionally be connected to dummy M2 by a dummy vial if the two dummy metal layers (e.g., M1, M2) are placed such that they overlap one another.

The DCs are typically substantially uniformly distributed in the active areas across a full die area of the IC. As used herein, being "substantially uniformly distributed" means the DC's are not confined to periphery locations such as the scribe seal or corner cells with DC's also being present including near a center of the IC die. The DC's can provide a contact pattern density that is greater than (>) a contact pattern density of the active contacts on the IC. The total DC density can be $\geq$3%, such as 4%, 5%, or more.

Figure 2A:
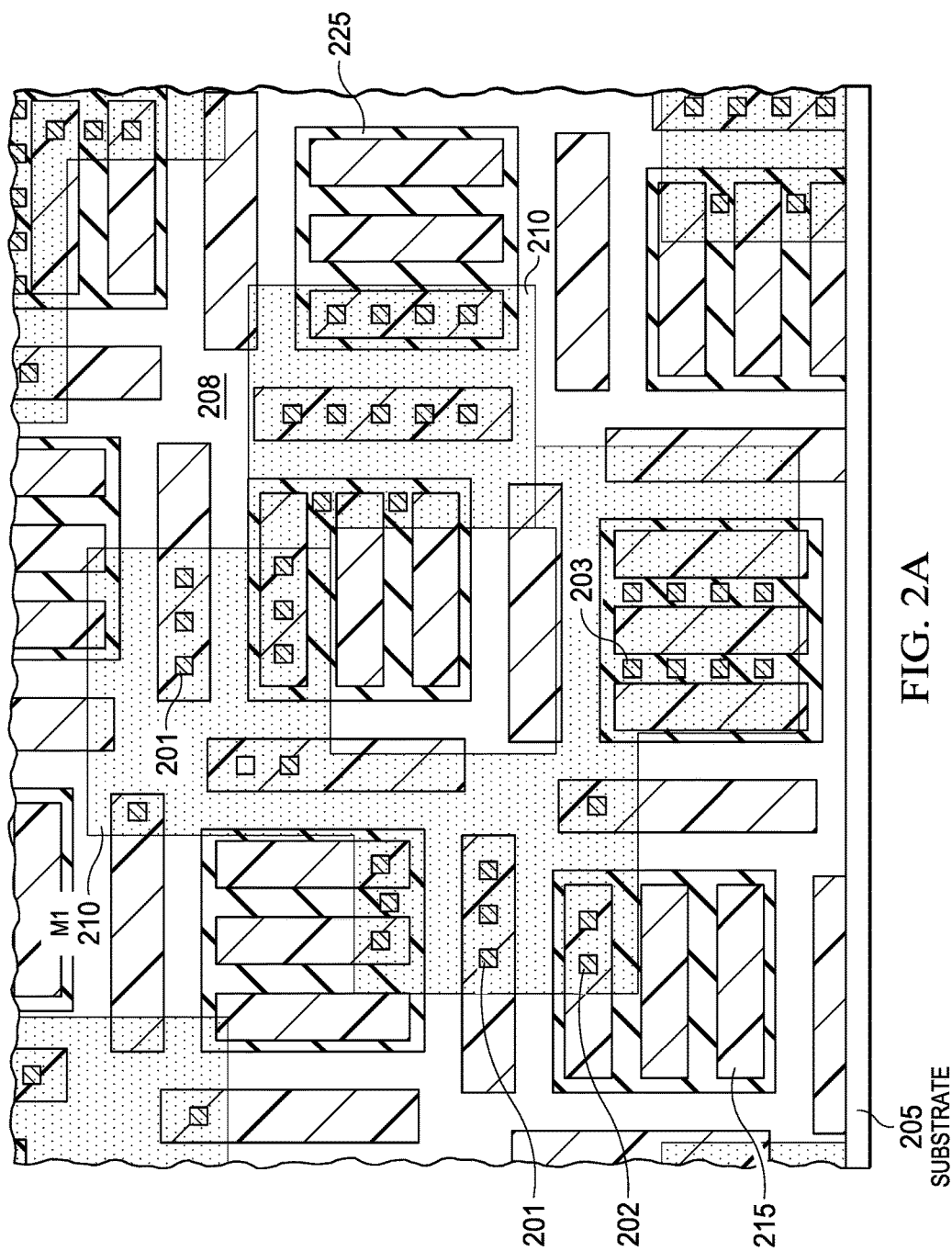
FIG. 2A is a top view of an example layout of a portion of an in-process IC with only the dummy portion shown that includes disclosed DC's, according to an example embodiment. DC's are shown including DC's to dummy polysilicon on field oxide, DC's to dummy polysilicon on dummy active area, and DC's between dummy polysilicon lines over active area.

FIG. 2A is a top view of an example layout of a portion of an in-process IC that includes disclosed DC's, according to an example embodiment. There are no active devices shown in FIG. 2A, only dummy fill. The IC is formed on a substrate 205 having a semiconductor surface. The substrate and/or semiconductor surface can comprise silicon, silicon-germanium, or other semiconductor material. The gate electrode material 215 is described as being polysilicon only as an example. The gate electrode material can also comprise a metal, a metal alloy, or a metal compound. The metal compound can comprise a metal nitride (e.g., TiN) or a metal silicide (e.g., NiSi), where the other constituent is not a metal. DC's are shown including DC's 201 to dummy polysilicon on field oxide 208 or other field dielectric, DC's 202 to dummy polysilicon on dummy parts of the active area 225, and DC's 203 to dummy parts of the active area 225 between dummy polysilicon lines. Metal 1 is shown as 210.

Figure 2B:
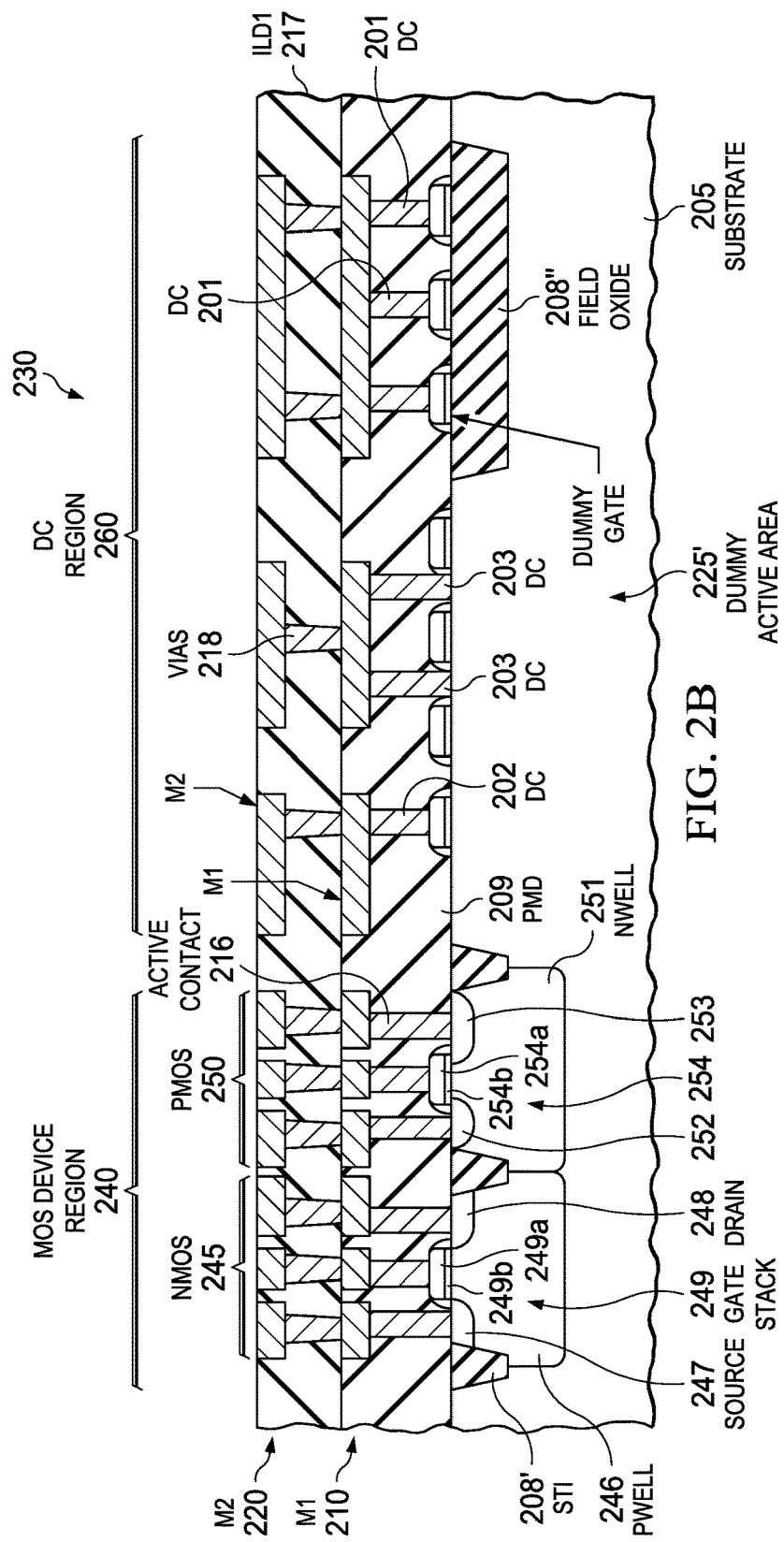
FIG. 2B is a cross sectional depiction of a Complementary MOS (CMOS) IC portion that includes MOS devices in a MOS device region and disclosed DC's in a DC region.

FIG. 2B is a cross sectional depiction of a CMOS IC portion 230 that includes a plurality of MOS devices and disclosed DC's. CMOS IC portion 230 includes MOS devices in a MOS device region 240 and disclosed DC's in a DC region 260. In the MOS device region 240 there is shown an NMOS device 245 in a pwell 246 including a source 247, a drain 248 and a gate stack 249, and a PMOS device 250 in an nwell 251 including a source 252, a drain 253 and a gate stack 254. The gate stack 249 comprises a gate electrode 249a over a gate dielectric 249b, and the gate stack 254 comprises a gate electrode 254a over a gate dielectric 254b. The field dielectric is shown as shallow trench isolation (STI) 208' framing the MOS device region 240 and field oxide 208" in the DC region 260.

There is a PMD layer 209 between the substrate surface of substrate 205 and M1 210 including over the gate electrode layer, and a first interlayer dielectric (ILD1) 217 between M1 210 and M2 220. There are vias 218 in the ILD1 217 filled with an electrically conductive plug material from M2 220 to M1 210. There are contacts filled with an electrically conductive plug material through the PMD layer 209 between M1 210 including active contacts 216 and DC's including DC's 201 to dummy polysilicon on field oxide 208", DC's 202 to dummy gate electrode material (e.g., polysilicon) on dummy parts of the active area shown as dummy active area 225', and DC's 203 to dummy parts of the active area 225' between gate electrode material (e.g., polysilicon) lines.

The metallization with interconnects shown in FIG. 2B is such that the active contacts 216 are connected to the MOS devices 245 and 250 including to M2 220, and are further electrically connected (not shown) to other nodes in the IC to affect the operation of the IC. The metallization with interconnects is such that the DC's 201, 202 and 203 are not electrically connected to any electrical components (e.g., transistors, diodes) and thereby do not affect the operation of the IC.

EXAMPLES

Disclosed embodiments of the invention are further illustrated by the following specific Examples, which should not be construed as limiting the scope or content of this Disclosure in any way.

A disclosed DC placement algorithm was applied that added disclosed DCs to the contact mask reticle so that the total DC density was increased from ~1% to ~5%, which is well within the range that typical IC products generally have. A contact mask reticle was generated using this updated contact design data and four lots were run with a split between wafers patterned with the original contact reticle (no DC's as a control) and the new contact reticle. The gate structure comprised polysilicon on a silicon oxide gate dielectric layer that was about 1.5 nm for a thinner gate oxide tested and 3 nm for a thicker gate oxide tested. Both were present in the wafer in different locations, but the thinner gate oxide did not receive plasma damage because it was thin enough to have enough leakage that charge did not build up across the dielectric.

The contact etch comprised plasma etching at an RF power of about 2,000 W. There were several power supplies and several steps in the etch process and different power levels associated with them, where 2,000 W was the highest power used during the main contact etch step. There were no differences other than the contact mask in the processing between the two experimental splits which included the full IC process run through passivation.

In the normal probability plot data shown in FIG. 3 sites with gate oxide leakage values above the upper specification limit (USL) shown were considered failing. For the new contact reticle (shown as "new"), there were no antenna fails found across a total of 22 wafers in the four lots (using a stringent all-site parametric test). For the wafers that used the original contact reticle that lacked disclosed DC's (shown as "old") there was about a 15% to 20% site failure rate, consistent with prior results obtained.

Disclosed embodiments can be used to form semiconductor die that may be integrated into a variety of assembly flows to form a variety of different devices and related products. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, Insulated Gate Bipolar Transistor (IGBT), CMOS, BiCMOS and MEMS.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

The invention claimed is:

1. A method of limiting plasma charging damage on a metal-oxide-semiconductor (MOS) integrated circuit (IC) including MOS transistors, comprising:
    providing a substrate having a semiconductor surface including a plurality of die, each die including a plurality of gate stacks including a gate electrode over a gate dielectric on active areas defined by a field dielectric, wherein at least some of the plurality of gate stacks include dummy gate stacks;
    forming a pre-metal dielectric (PMD) layer over the plurality of gate stacks;
    defining a contact masking material pattern on said PMD layer using a contact mask, said contact masking material pattern including first contact defining features for forming active contacts over said active areas and said gate electrodes of said gate stacks that correspond to said MOS transistors and second contact defining features for forming dummy contacts, said dummy contacts including dummy contacts formed over said gate electrodes of said plurality of dummy gate stacks, and over dummy portions of said active areas between adjacent ones of said dummy gate stacks, said dummy portions of said active areas lacking source/drain implants;
    etching contacts through said PMD layer using said contact masking material pattern to form said active contacts and said dummy contacts;
    filling said active contacts and said dummy contacts with a plug material;
    forming a patterned metal 1 (M1) layer including first M1 portions over said active contacts and dummy M1 portions over said dummy contacts;
    forming interconnects using metallization processing so that said active contacts are connected by said interconnects to said MOS transistors and said dummy contacts are not electrically connected by said interconnects to said MOS transistors;
    forming a plurality of vias over said patterned M1 layer, said plurality of vias including first vias each connected to one of said first M1 portions and dummy vias each connected to one of said dummy M1 portions;

forming a patterned metal 2 (M2) layer over said patterned M1 layer, said patterned M2 layer including first M2 portions each connected to one of said first M1 portions by one of said first vias and dummy M2 portions each connected to one of said dummy M1 portions by one of said dummy vias; and forming additional dummy gate stacks on a field oxide region of said field dielectric, each of said additional dummy stacks being formed only on said field oxide region so as to be separated from said substrate, wherein each additional dummy gate stack includes a gate electrode over a gate dielectric, wherein said PMD layer is also formed over said additional dummy gate stacks, and wherein said dummy contacts further include dummy contacts formed over said additional dummy gate stacks.

2. The method of claim 1, wherein said contact mask is generated to locate said second contact defining features for forming said dummy contacts in at least two of a first position corresponding to locations where said dummy M1 portions cover said additional dummy gate stacks located over said field oxide region of said field dielectric after forming said patterned M1 layer, a second position corresponding to locations where said dummy gate stacks are located over said dummy portions of said active area, and a third position corresponding to locations in said dummy portions of said active area located between said adjacent ones of said dummy gate stacks.

3. The method of claim 2, wherein said second contact defining features are located in all of said first, second, and third positions so that said dummy contacts are formed in all of said first, second, and third positions.

4. The method of claim 1, wherein etching said contacts comprises plasma etching.

5. The method of claim 1, wherein said dummy contacts are substantially uniformly distributed in said active areas across a die area of said IC.

6. The method of claim 1, wherein said dummy contacts provide a contact pattern density that is greater than (>) a contact pattern density of said active contacts.

7. The method of claim 1, comprising providing an etch stop layer between said gate stacks and said PMD layer.

8. The method of claim 1, wherein said gate electrode comprises polysilicon.

9. The method of claim 1, wherein said gate electrode comprises a metal, a metal alloy, or a metal compound.

10. The method of claim 1, wherein said substrate has an uppermost surface that is substantially flush with an uppermost surface of said field oxide region.

11. A metal-oxide-semiconductor (MOS) integrated circuit (IC), comprising:

a substrate having a semiconductor surface;

a plurality of MOS transistors each including a source, a drain, and a gate stack on said semiconductor surface including a gate electrode over a gate dielectric on active areas defined by a field dielectric on said substrate;

a plurality of dummy gate stacks including first dummy gate stacks and second dummy gate stacks, each of said first and second dummy gate stacks including a dummy gate electrode over a dummy gate dielectric, said first dummy gate stacks disposed on dummy portions of said active area and said second dummy gate stacks disposed on a field oxide region of said field dielectric, wherein each of said second dummy gate stacks is disposed only on said field oxide region so as to be separated from said substrate;

a pre-metal dielectric (PMD) layer over said gate electrodes of said plurality of gate stacks and over said dummy gate electrodes of said first and second dummy gate stacks;

contact openings through said PMD layer including active contacts and dummy contacts, said active contacts and said dummy contacts both filled with a plug material;

a patterned metal 1 (M1) layer including first M1 portions over said active contacts and dummy M1 portions over said dummy contacts, and at least one patterned metal upper level above said patterned M1 layer;

a plurality of vias including first vias that connect said at least one patterned metal upper level to said first M1 portions, and dummy vias that connect said at least one patterned metal upper level to said dummy M1 portions; and interconnects that connect said active contacts to said MOS transistors, and wherein said dummy contacts are not electrically connected by said interconnects to said MOS transistors and land on said dummy portions of said active area between adjacent ones of said first dummy gate stacks, said dummy portions of said active areas lacking source/drain implants.

12. The IC of claim 11, wherein said dummy contacts are located in at least two of a first position where said dummy M1 portions cover said second dummy gate stacks disposed on said field oxide region of said field dielectric, a second position where said first dummy gate stacks are disposed on said dummy portions of said active area, and a third position where said dummy portions of said active area are located between said adjacent ones of said first dummy gate stacks.

13. The IC of claim 12, wherein said dummy contacts are located in all of said first, second and third positions.

14. The IC of claim 12, wherein a first dummy contact of said dummy contacts located at said second position contacts one of said first dummy gate stacks disposed on dummy portions of said active area, but does not contact said dummy portions of said active area.

15. The IC of claim 11, wherein said dummy contacts are substantially uniformly distributed in said active areas across a die area said IC.

16. The IC of claim 11, wherein said IC comprises a complementary metal-oxide-semiconductor (CMOS) IC and said semiconductor surface comprises silicon.

17. The IC of claim 11, wherein said gate electrode and said dummy gate electrode comprise polysilicon.

18. The IC of claim 11, wherein a thickness of each of said gate dielectric and said dummy gate dielectric is at least (>) 1.5 nm thick.

19. The IC of claim 11, said gate electrode and said dummy gate electrode comprise a metal, a metal alloy, or a metal compound.

20. The IC of claim 11, wherein said substrate has an uppermost surface that is substantially flush with an uppermost surface of said field oxide region.

* * * * *